United States Patent
Wada et al.

(10) Patent No.: US 11,081,657 B2
(45) Date of Patent: Aug. 3, 2021

(54) RADIATION DETECTOR

(71) Applicant: KABUSHIKI KAISHA TOSHIBA, Minato-ku (JP)

(72) Inventors: Atsushi Wada, Kawasaki (JP); Isao Takasu, Setagaya (JP); Rei Hasegawa, Yokohama (JP); Fumihiko Aiga, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 16/566,475

(22) Filed: Sep. 10, 2019

(65) Prior Publication Data
US 2020/0313094 A1 Oct. 1, 2020

(30) Foreign Application Priority Data
Feb. 22, 2019 (JP) .............................. JP2019-030387

(51) Int. Cl.
*H01L 33/00* (2010.01)
*H01L 51/00* (2006.01)
(Continued)

(52) U.S. Cl.
CPC ...... *H01L 51/0085* (2013.01); *H01L 51/0036* (2013.01); *H01L 51/0046* (2013.01);
(Continued)

(58) Field of Classification Search
CPC ..... H01L 51/424–4246; H01L 51/4266; H01L 51/0085; H01L 51/0087; H01L 51/0084–0088; H01L 51/0036
See application file for complete search history.

(56) References Cited

U.S. PATENT DOCUMENTS 10,651,409 B2 * 5/2020 Huang ................ H01L 51/4273
2008/0116536 A1 * 5/2008 Forrest ................ H01L 27/302
257/431
(Continued)

FOREIGN PATENT DOCUMENTS

| JP | 2009-054936 A | 3/2009 |
| JP | 2010-067642 A | 3/2010 |

(Continued)

OTHER PUBLICATIONS

Kumano, M. et al., "A ternary blend of a polymer, fullerene, and insulating self-assembling triptycene molecules for organic photovoltaics," Journal of Materials Chemistry A, 2016, pp. 18490-18498.

*Primary Examiner* — Mary A Wilczewski
*Assistant Examiner* — Tsz K Chiu
(74) *Attorney, Agent, or Firm* — Oblon, McClelland, Maier & Neustadt, L.L.P.

(57) ABSTRACT

According to one embodiment, a radiation detector includes a first conductive layer, a second conductive layer, and a first layer. The first layer is provided between the first conductive layer and the second conductive layer. The first layer includes a first region and a second region. The first region includes a metal complex including a first metallic element. The second region includes an organic semiconductor material. The first metallic element includes at least one selected from the group consisting of Ir, Pt, Pb, and Cu.

12 Claims, 5 Drawing Sheets

(51) Int. Cl.
  *H01L 27/30* (2006.01)
  *H01L 51/42* (2006.01)

(52) U.S. Cl.
  CPC ........ *H01L 51/0047* (2013.01); *H01L 27/305* (2013.01); *H01L 51/424* (2013.01)

(56) References Cited

U.S. PATENT DOCUMENTS

| | | | | |
|---|---|---|---|---|
| 2008/0149171 A1* | 6/2008 | Lu | ...... | H01L 51/4266 136/252 |
| 2009/0084436 A1* | 4/2009 | Yang | ...... | H01L 51/426 136/256 |
| 2011/0309462 A1* | 12/2011 | Sargent | ...... | H04N 5/369 257/443 |
| 2011/0315972 A1* | 12/2011 | Takahashi | ...... | H01L 51/0097 257/40 |
| 2012/0125427 A1* | 5/2012 | Park | ...... | B82Y 10/00 136/256 |
| 2014/0191218 A1* | 7/2014 | Katz | ...... | H01L 51/4273 257/40 |
| 2018/0143329 A1* | 5/2018 | Takasu | ...... | G01T 1/203 |
| 2019/0056515 A1* | 2/2019 | Kobayashi | ...... | G01T 1/2008 |
| 2020/0264320 A1* | 8/2020 | Aiga | ...... | G01T 1/2018 |
| 2021/0055435 A1* | 2/2021 | Aiga | ...... | G01T 1/247 |

FOREIGN PATENT DOCUMENTS

| | | | |
|---|---|---|---|
| JP | 2010-510657 A | 4/2010 | |
| JP | 2012-142467 A | 7/2012 | |
| JP | 5258037 B2 | 8/2013 | |
| JP | 2013-541837 A | 11/2013 | |
| JP | 2016-225456 A | 12/2016 | |
| JP | 2017-175108 A | 9/2017 | |
| JP | 2018-157170 A | 10/2018 | |
| WO | WO-2006092135 A1 * | 9/2006 | ........ H01L 51/0048 |

* cited by examiner

RADIATION DETECTOR

CROSS-REFERENCE TO RELATED APPLICATIONS

This application is based upon and claims the benefit of priority from Japanese Patent Application No. 2019-030387, filed on Feb. 22, 2019; the entire contents of which are incorporated herein by reference.

FIELD

Embodiments described herein relate generally to a radiation detector.

BACKGROUND

For example, there is a radiation detector that uses an organic semiconductor material. It is desirable to increase the sensitivity of the radiation detector.

DETAILED DESCRIPTION

Figure 1:
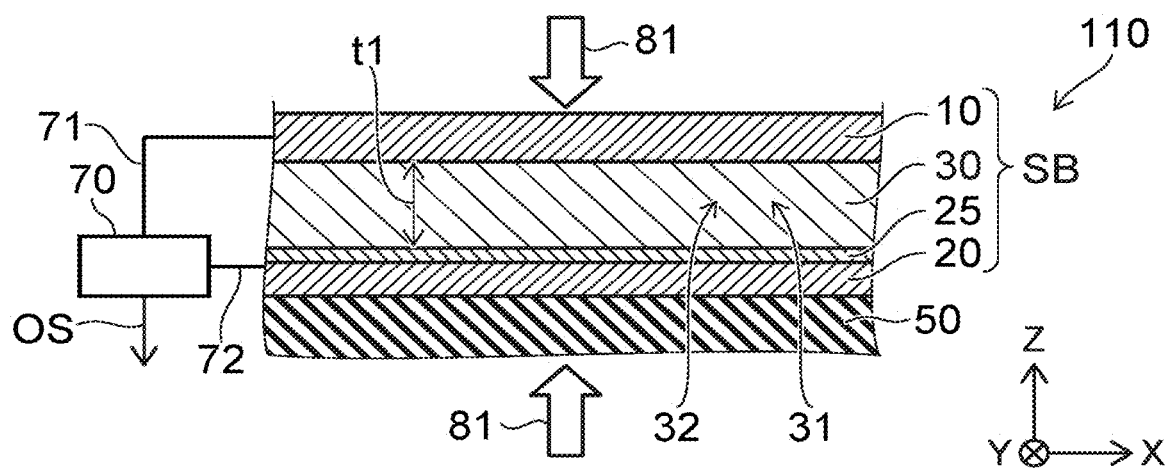
FIG. 1 is a schematic cross-sectional view illustrating a radiation detector according to a first embodiment.

According to one embodiment, a radiation detector includes a first conductive layer, a second conductive layer, and a first layer. The first layer is provided between the first conductive layer and the second conductive layer. The first layer includes a first region and a second region. The first region includes a metal complex including a first metallic element. The second region includes an organic semiconductor material. The first metallic element includes at least one selected from the group consisting of Ir, Pt, Pb, and Cu.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic cross-sectional view illustrating a radiation detector according to a first embodiment.

As shown in FIG. 1, the radiation detector 110 according to the embodiment includes a first conductive layer 10, a second conductive layer 20, and a first layer 30.

The first layer 30 is provided between the first conductive layer 10 and the second conductive layer 20. The first layer 30 includes a first region 31 and a second region 32. The first region 31 includes a metal complex. The metal complex includes a first metallic element.

The first metallic element includes, for example, at least one selected from the group consisting of Ir, Pt, Pb, and Cu. For example, the atomic number of the first metallic element is 29 or more. The first metallic element is, for example, a heavy element.

The second region 32 includes an organic semiconductor material.

Examples of the materials included in the first layer 30 will now be described.

Figure 2:
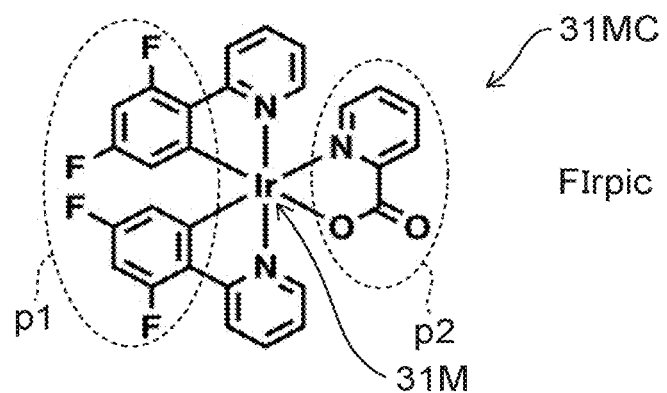
FIG. 2 is a chemical formula illustrating materials included in the radiation detector according to the first embodiment.
Figure 3:
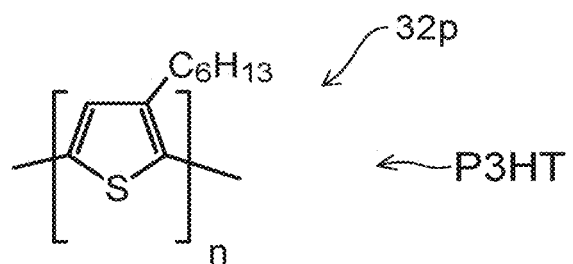
FIG. 3 is a chemical formula illustrating materials included in the radiation detector according to the first embodiment.
Figure 4:
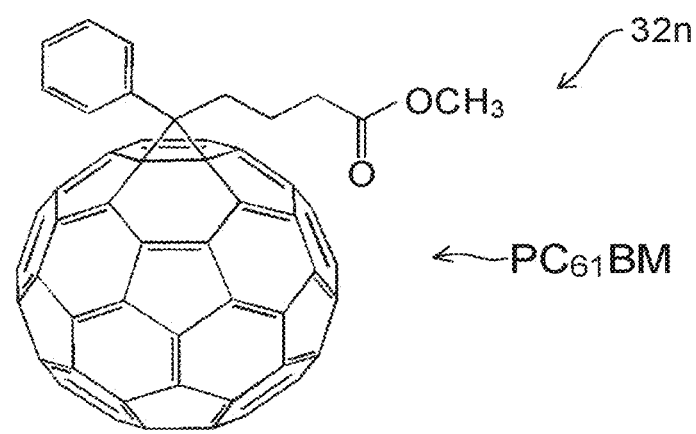
FIG. 4 is a chemical formula illustrating materials included in the radiation detector according to the first embodiment.

FIG. 2 to FIG. 4 are chemical formulas illustrating materials included in the radiation detector according to the first embodiment.

As shown in FIG. 2, a metal complex 31MC that is included in the first region 31 includes, for example, FIrpic (bis(4,6-difluorophenylpyridinato-N,C2)). A first metallic element 31M that is included in the metal complex 31MC includes, for example, iridium.

The organic semiconductor material that is included in the second region 32 includes a p-type region and an n-type region. As shown in FIG. 3, the p-type region 32p includes, for example, P3HT (poly(3-hexylthiophene)). As shown in FIG. 4, the n-type region 32n includes fullerene. The n-type region 32n includes, for example, $PC_{61}BM$ ([6,6]-phenyl-$C_{61}$-butyric acid methyl ester).

The first layer 30 is an organic layer including such materials.

An intermediate layer 25 may be provided as shown in FIG. 1. The intermediate layer 25 is provided between the second conductive layer 20 and the first layer 30. The intermediate layer 25 is provided as necessary and may be omitted.

For example, the second conductive layer 20 is provided on a base body 50. The intermediate layer 25 is provided on the second conductive layer 20. The first layer 30 is provided on the intermediate layer 25. The first conductive layer 10 is provided on the first layer 30. The second conductive layer 20, the intermediate layer 25, the first layer 30, and the first conductive layer 10 are included in a stacked body SB.

As shown in FIG. 1, a first direction from the second conductive layer 20 toward the first conductive layer 10 is taken as a Z-axis direction. One direction perpendicular to the Z-axis direction is taken as an X-axis direction. A direction perpendicular to the Z-axis direction and the X-axis direction is taken as a Y-axis direction. The first direction is the stacking direction.

For example, the first conductive layer 10 and the second conductive layer 20 spread along the X-Y plane. The first layer 30 and the intermediate layer 25 spread along the X-Y plane.

In one example, a thickness t1 of the first layer 30 along the first direction (referring to FIG. 1) is 10 μm or more. In the embodiment, the thickness t1 may be 40 μm or more.

A detection circuit 70 is provided in the example. The detection circuit 70 is electrically connected to the first conductive layer 10 and the second conductive layer 20. For example, the detection circuit 70 and the first conductive layer 10 are electrically connected by a first interconnect 71. For example, the detection circuit 70 and the second conductive layer 20 are electrically connected by a second interconnect 72. The detection circuit 70 outputs a signal OS corresponding to the intensity of radiation 81 incident on the stacked body SB.

The radiation 81 includes, for example, β-rays. The radiation may include, for example, γ-rays. The radiation 81 may be incident on the stacked body SB from the first conductive layer 10 side. The radiation 81 may be incident on the stacked body SB from the second conductive layer 20 side.

When the radiation 81 enters the first layer 30 of the stacked body SB, a movable charge is generated in the first layer 30. A voltage is applied between the first conductive layer 10 and the second conductive layer 20 by the detection circuit 70. Thereby, the generated charge moves toward the first conductive layer 10 or the second conductive layer 20. The charge that has moved is detected by the detection circuit 70. The radiation 81 of the detection object can be detected thereby.

By experiments of the inventor, it was found that high detection sensitivity is obtained by the first layer 30 including the first region 31 including the metal complex 31MC. Examples of experimental results will now be described.

In the samples of the experiment, the base body 50 is a glass substrate. The second conductive layer 20 is a layer of ITO (Indium Tin Oxide) having a thickness of 50 nm. The intermediate layer 25 includes a mixture of poly(ethylene-dioxythiophene) and poly(styrenesulfonic acid) (PEDOT: PSS). The thickness of the intermediate layer 25 is 30 nm. The first conductive layer 10 is an aluminum layer having a thickness of 300 nm.

In the first layer 30 of a first sample, the second region 32 is provided; but the first region 31 is not provided. The second region 32 includes P3HT and $PC_{61}BM$. The mole ratio (P3HT:$PC_{61}BM$) of these materials is 1:1.

In the first layer 30 of second to fourth samples, the first region 31 is provided in addition to the second region 32. The material of the second region 32 is the same as the material of the second region 32 of the first sample. The first region 31 includes FIrpic. The concentration of the metal complex 31MC (the first region 31) in the first layer 30 is different between the second to fourth samples. Namely, in the second sample, the concentration of the metal complex 31MC in the first layer 30 is 12.8 wt %. In the third sample, the concentration of the metal complex 31MC in the first layer 30 is 6.4 wt %. In the fourth sample, the concentration of the metal complex 31MC in the first layer 30 is 25.1 wt %. The mole ratio of the first region 31 and the second region 32 is 1:1.

In a first experiment, light is irradiated on the sample without irradiating the radiation 81. The wavelength of the light is 530 nm. A signal that corresponds to the irradiated light is detected by the detection circuit 70. The conversion efficiency is calculated based on the obtained signal.

Figure 5:
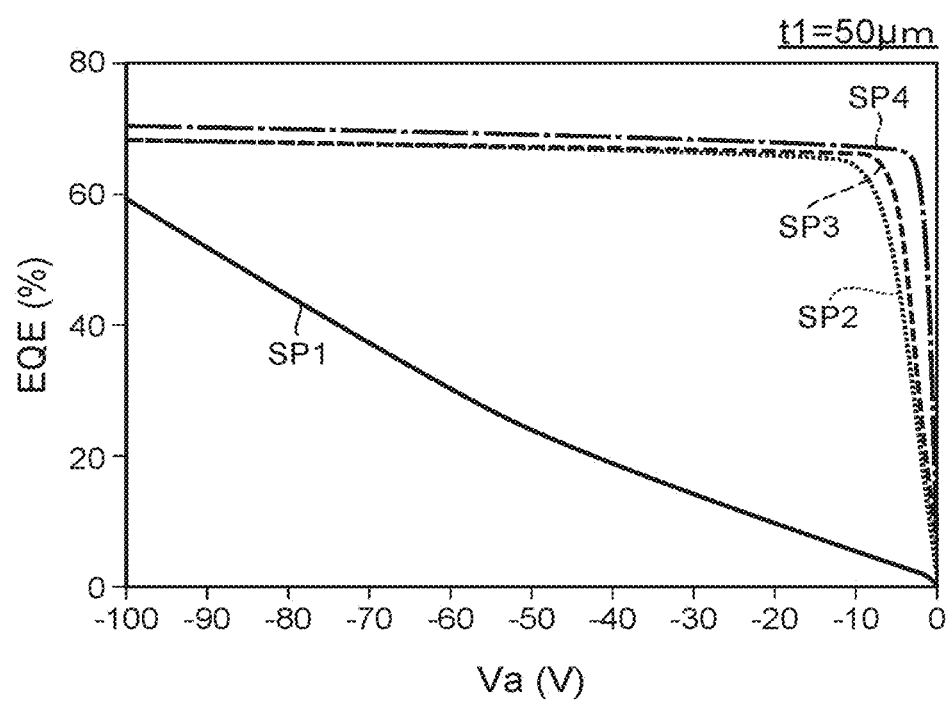
FIG. 5 is a graph illustrating characteristics of the radiation detector.

FIG. 5 is a graph illustrating characteristics of the radiation detector.

In FIG. 5, the horizontal axis is a voltage Va (V) applied between the first conductive layer 10 and the second conductive layer 20. The vertical axis is a conversion efficiency EQE (%). The results of the first to fourth samples SP1 to SP4 are shown in FIG. 5. FIG. 5 shows the results when the thickness t1 of the first layer 30 is 50 μm.

It can be seen from FIG. 5 that the conversion efficiency EQE of the second to fourth samples SP2 to SP4 is markedly high compared to the conversion efficiency EQE of the first sample SP1. In the second to fourth samples SP2 to SP4, a high conversion efficiency EQE is obtained even when the absolute value of the voltage Va is small.

Figure 6:
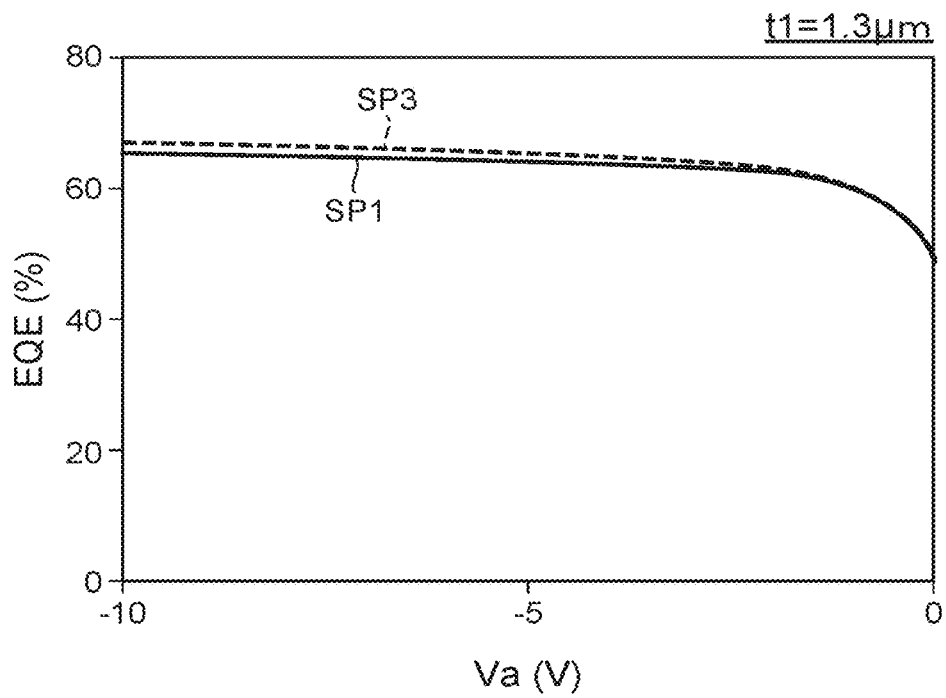
FIG. 6 is a graph illustrating characteristics of the radiation detector.

FIG. 6 is a graph illustrating characteristics of the radiation detector.

In FIG. 6, the horizontal axis is the voltage Va (V). The vertical axis is the conversion efficiency EQE (%). FIG. 6 shows the results when the thickness t1 of the first layer 30 is 1.3 μm. FIG. 6 illustrates the results of the first sample SP1 (no metal complex 31MC) and the third sample SP3 (the concentration of the metal complex 31MC being 6.4 wt %) recited above.

It can be seen from FIG. 6 that when the thickness t1 of the first layer 30 is thin such as 1.3 μm, the conversion efficiency EQE of the first sample SP1 is substantially the same as the conversion efficiency EQE of the third sample SP3. The behavior of the conversion efficiency is much different between when the thickness t1 of the first layer 30 is thick (FIG. 5) and when the thickness t1 of the first layer 30 is thin (FIG. 6). Such a phenomenon generally is not predicted.

The FIrpic that is used as the metal complex 31MC in the experiment recited above is used as, for example, the material of an organic light-emitting element. In the organic light-emitting element, the thickness of the organic layer including FIrpic is thin, i.e., about 5 μm or less to reduce the drive voltage. Therefore, conventionally, it had been considered that results such as those illustrated in FIG. 6 are obtained. However, by the experiments relating to the thick first layer 30 performed by the inventor of the application, it was found that the existence or absence of FIrpic greatly affects the conversion efficiency EQE.

For example, the large improvement of the conversion efficiency EQE is considered to be related to the introduction of the metal complex 31MC (e.g., FIrpic, etc.) improving the ease of extracting the charge, which is a problem particularly when thick. Further, as described below, there is a possibility that the introduction of the metal complex 31MC may make it easy to form a state in which the p-type region 32p and the n-type region 32n mix uniformly. There is a possibility that the uniform mixed state acts effectively to increase the sensitivity when the thickness t1 of the first layer 30 is thick.

Figure 7:
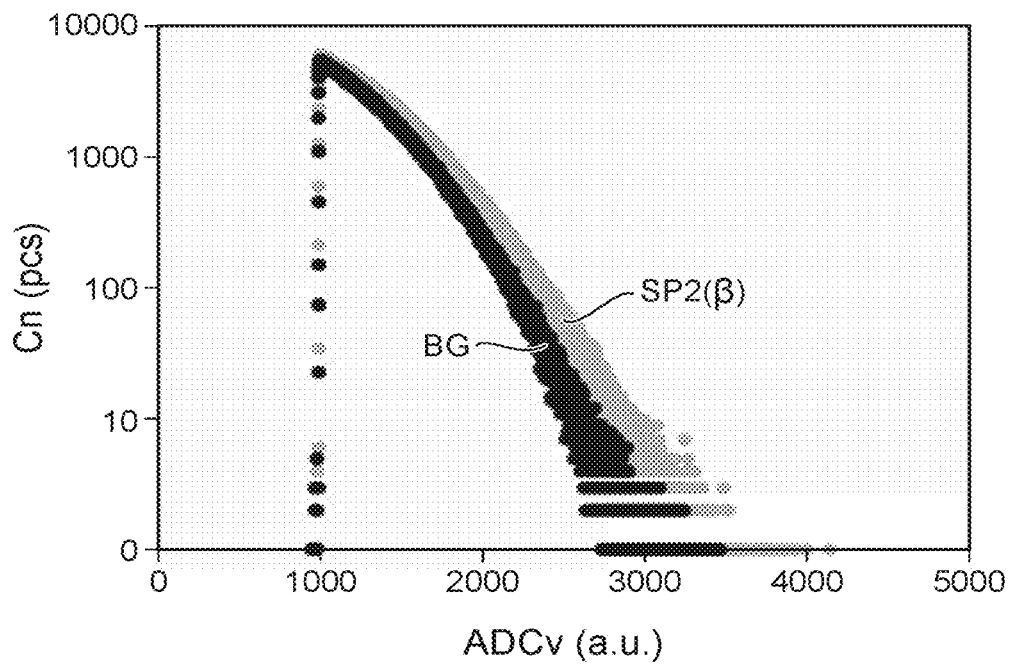
FIG. 7 is a graph illustrating characteristics of the radiation detector.

FIG. 7 is a graph illustrating characteristics of the radiation detector.

The figure illustrates the results when β-rays are irradiated on the sample. In the figure, the horizontal axis is an ADC value ADCv (arbitrary units) of the magnitude of the detected signal. The vertical axis is a count Cn (units: counts) of the detected signal. FIG. 7 shows a characteristic SP2(β) when β-rays are irradiated on the second sample SP2 (the concentration of the metal complex 31MC being 12.8 wt %) in which the thickness t1 of the first layer 30 is 50 μm, and a background characteristic BG on which β-rays are not incident. As shown in FIG. 7, the signal (the count Cn) that corresponds to the incident β-rays is obtained. According to the embodiment, radiation such as β-rays, etc., can be detected with high sensitivity.

For example, it is considered that the radiation 81 is absorbed efficiently in the metal complex 31MC including the first metallic element 31M which is a heavy element. It is considered that a high efficiency is obtained thereby.

In a reference example (e.g., the first sample SP1 recited above or the like) that does not include the first region 31 including the metal complex 31MC, the first layer 30 that includes only the second region 32 is set to be thick to absorb the radiation 81. It is difficult to extract the generated charge when the first layer 30 is thick.

Conversely, in the embodiment, by providing the first region 31 including the metal complex 31MC, the radiation 81 can be absorbed efficiently even in the case where the first layer 30 is thin. Also, by setting the bandgap of the metal complex 31MC appropriately, the generated charge can be extracted easily regardless of the thickness of the first layer 30. Thereby, it is considered that the radiation 81 can be detected with high sensitivity.

Thus, according to the embodiment, a radiation detector can be provided in which the sensitivity can be increased.

In the embodiment, it is favorable for the concentration of the metal complex 31MC in the first layer 30 to be 6.4 wt % or more. Thereby, for example, high sensitivity is obtained stably.

In the embodiment, it is favorable for the first metallic element 31M included in the metal complex 31MC to include, for example, at least one selected from the group consisting of Jr, Pt, Pb, and Cu. For example, it is favorable for the atomic number of the first metallic element 31M to be 29 or more. The first metallic element 31M is a heavy element. By using such a first metallic element 31M, the radiation is converted efficiently into the signal. The metal complex 31MC includes, for example, iridium.

Figure 8:
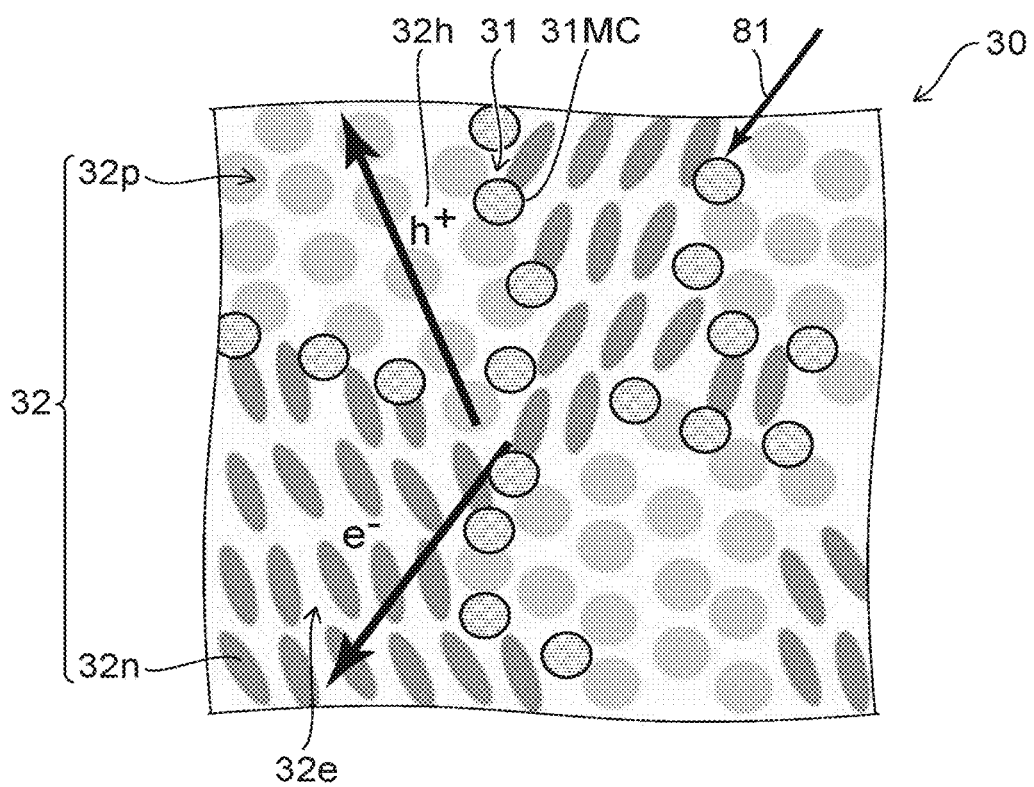
FIG. 8 is a schematic view illustrating a portion of the radiation detector.

FIG. 8 is a schematic view illustrating a portion of the radiation detector.

As shown in FIG. 8, the first layer 30 includes the first region 31 and the second region 32. The first region 31 includes the metal complex 31MC. The organic semiconductor material that is included in the second region 32 includes the p-type region 32p and the n-type region 32n. At least a portion of the first region 31 is between the p-type region 32p and the n-type region 32n.

Because the first region 31 is between the p-type region 32p and the n-type region 32n, for example, electrons 32e that are generated when the radiation 81 enters the first region 31 move easily into the n-type region 32n. For example, holes 32h that are generated when the radiation 81 enters the first region 31 move easily into the p-type region 32p. A higher efficiency is obtained thereby.

Because the first region 31 is between the p-type region 32p and the n-type region 32n, for example, it is easy for the p-type region 32p and the n-type region 32n to be mixed uniformly. Thereby, the uniformity of the thickness of the first layer 30 is high.

For example, it is considered that such a configuration is obtained easily by causing the structure of the metal complex 31MC to be asymmetric.

For example, as shown in FIG. 2, the metal complex 31MC includes a first portion p1 and a second portion p2. The first metallic element 31M is between the first portion p1 and the second portion p2. The first portion p1 includes fluorine. The second portion p2 includes oxygen. The second portion p2 may include nitrogen. In the region corresponding to the first portion p1, for example, the polarity is low; and the surface energy is small. In the region corresponding to the second portion p2, for example, the polarity is high; and the surface energy is large.

Thus, the metal complex 31MC includes multiple portions (the first portion p1 and the second portion p2) having mutually-different properties. For example, one of the p-type region 32p or the n-type region 32n adsorbs to the first portion p1 relatively easily. On the other hand, for example, the other of the p-type region 32p or the n-type region 32n adsorbs to the second portion p2 relatively easily. By such a configuration, the first region 31 easily is positioned between the p-type region 32p and the n-type region 32n. For example, the first region 31 segregates between the p-type region 32p and the n-type region 32n.

Because the first region 31 is positioned between the p-type region 32p and the n-type region 32n, the movement of the energy is easy. For example, the movement of the charge (the electrons 32e and the holes 32h) is easy.

Figure 9:
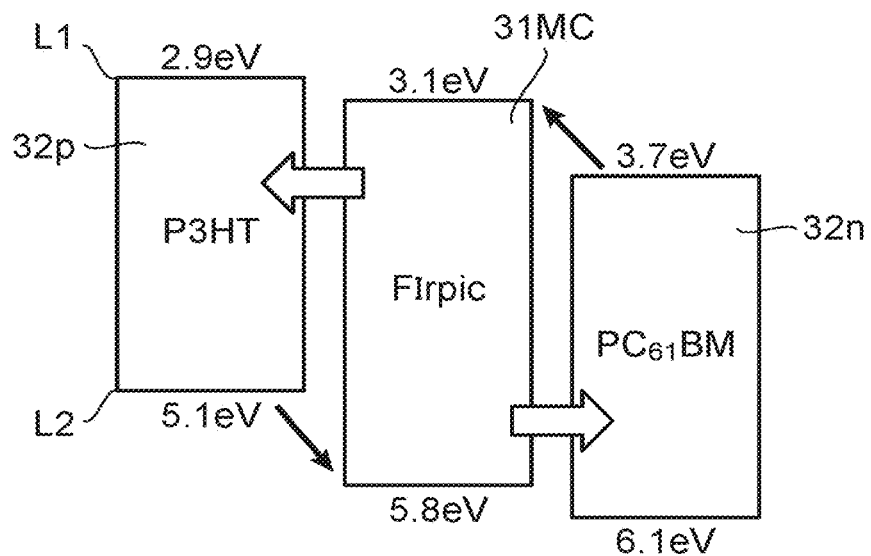
FIG. 9 is a schematic view illustrating bandgaps of the radiation detector.

FIG. 9 is a schematic view illustrating bandgaps of the radiation detector. P3HT is used as the p-type region 32p. In P3HT, the HOMO level L2 is 5.1 eV; and the LUMO level L1 is 2.9 eV. The bandgap of P3HT is 2.2 eV.

$PC_{61}BM$ is used as the n-type region 32n. In $PC_{61}BM$, the HOMO level L2 is 6.1 eV; and the LUMO level L1 is 3.7 eV. The bandgap of $PC_{61}BM$ is 2.4 eV.

FIrpic is used as the metal complex 31MC. In FIrpic, the HOMO level L2 is 5.8 eV; and the LUMO level L1 is 3.1 eV. The bandgap of FIrpic is 2.7 eV.

Thus, the bandgap of the metal complex 31MC is larger than the bandgap of the organic semiconductor material. The bandgap of the metal complex 31MC is larger than the bandgap of the p-type region 32p. The bandgap of the metal complex 31MC is larger than the bandgap of the n-type region 32n.

By such a relationship of the bandgaps, for example, the energy that is generated in the metal complex 31MC moves easily into the p-type region 32p. For example, the energy that is generated in the metal complex 31MC moves easily into the n-type region 32n. The generated energy can be extracted efficiently thereby.

It is favorable for the HOMO level L2 of the metal complex 31MC not to be excessively low (for the absolute value not to be excessively large). Thereby, the metal complex 31MC can be suppressed from becoming a hole/electron trap. A high efficiency is obtained easily.

Figure 10:
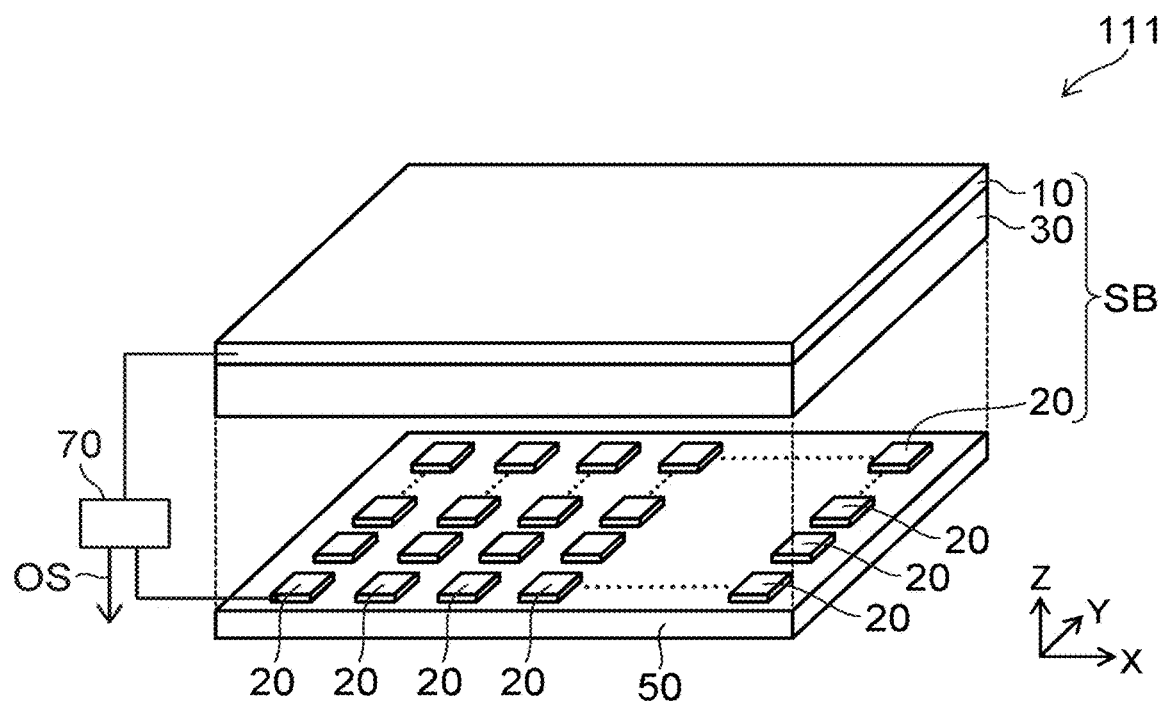
FIG. 10 is a schematic perspective view illustrating a radiation detector according to the first embodiment.

FIG. 10 is a schematic perspective view illustrating a radiation detector according to the first embodiment.

As shown in FIG. 10, the radiation detector 111 includes the stacked body SB. The intermediate layer 25 is not illustrated in FIG. 10. In FIG. 10, some of the components included in the radiation detector 111 are drawn as being separated from each other for easier viewing of the drawing.

Multiple second conductive layers 20 are provided in the radiation detector 111. The multiple second conductive layers 20 are arranged along a plane (e.g., the X-Y plane) crossing the Z-axis direction. For example, the multiple second conductive layers 20 are arranged in a matrix configuration along the X-axis direction and the Y-axis direction. In the example, the first conductive layer 10 and the first layer 30 each are provided to be continuous.

Second Embodiment

As described in reference to FIG. 5, a high conversion efficiency of light (e.g., visible light such as 530 nm) is obtained in the stacked body SB described in reference to the first embodiment. The stacked body SB can be used as a photoelectric conversion device.

Figure 11:
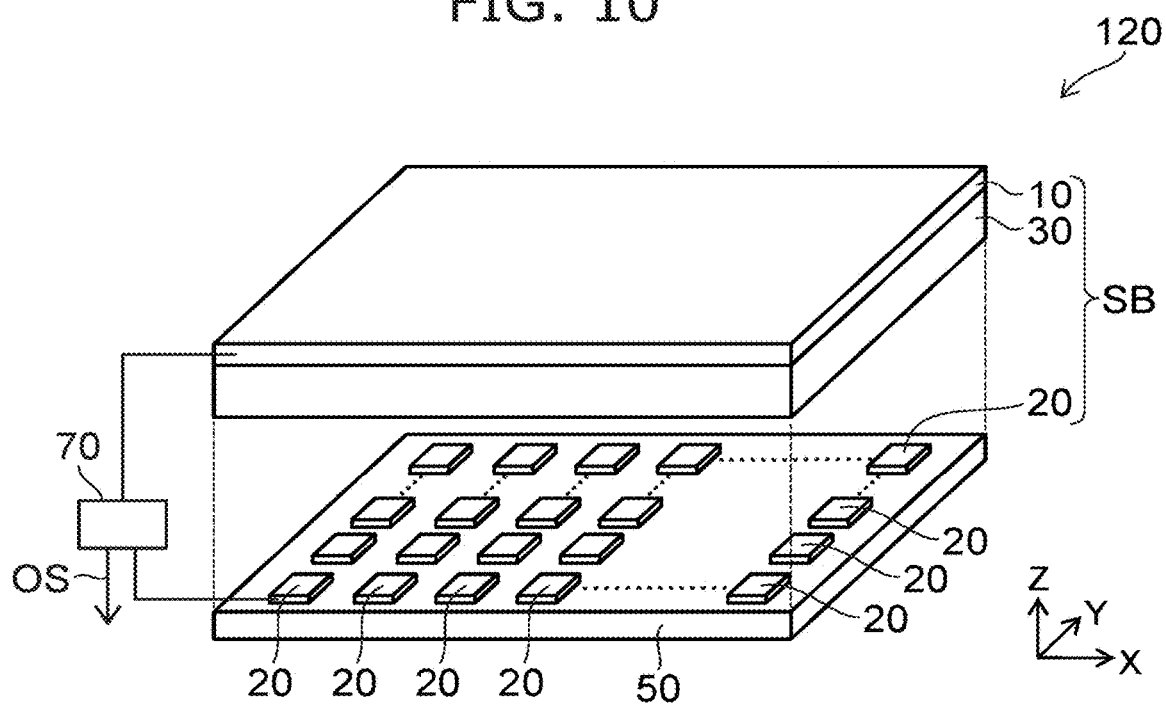
FIG. 11 is a schematic perspective view illustrating a photoelectric conversion device according to a second embodiment.

FIG. 11 is a schematic perspective view illustrating a photoelectric conversion device according to the second embodiment.

As shown in FIG. 11, the photoelectric conversion device 120 includes the stacked body SB. The photoelectric conversion device 120 includes, for example, the first conductive layer 10, the second conductive layers 20, and the first layer 30. The first layer 30 is provided between the first conductive layer 10 and the second conductive layers 20. The first layer 30 includes the first region 31 and the second region 32 (referring to FIG. 1). The first region 31 includes the metal complex 31MC (referring to FIG. 2). The metal complex 31MC includes the first metallic element 31M (referring to FIG. 2). For example, the first metallic element includes at least one selected from the group consisting of Ir, Pt, Pb, and Cu. For example, the atomic number of the first metallic element is 29 or more. The first metallic element is, for example, a heavy element. The second region 32 includes an organic semiconductor material. The organic semiconductor material (the second region 32) includes the p-type region 32p and the n-type region 32n (referring to FIG. 8). The configuration described in reference to the first embodiment is applicable to the stacked body SB. According to the second embodiment, a photoelectric conversion device can be provided in which the sensitivity can be increased.

In the embodiment, the base body 50 includes, for example, a light-transmissive material. The base body 50 includes, for example, at least one selected from the group consisting of glass and a resin. For example, the base body 50 transmits the radiation 81. For example, the base body 50 transmits visible light.

The second conductive layer 20 includes, for example, a metal oxide film. The metal oxide film includes, for example, at least one selected from the group consisting of indium oxide, zinc oxide, tin oxide, and ITO.

For example, the intermediate layer 25 functions as a planarizer. The intermediate layer 25 includes, for example, PEDOT:PSS. The intermediate layer 25 includes a polythiophene polymer. The intermediate layer 25 includes, for example, conductive ink.

The first conductive layer 10 includes, for example, a conductive metal oxide. The first conductive layer 10 includes, for example, a metal thin film. The first conductive layer 10 includes, for example, a film including an alloy. For example, the first conductive layer 10 transmits the radiation 81. For example, the first conductive layer 10 transmits visible light.

The material of the first region 31 includes, for example, a metal complex including a metal including at least one selected from the group consisting of Ir, Pt, Pb, and Cu.

The material of the p-type region 32p included in the second region 32 includes at least one of thiophene or a thiophene derivative.

The material of the n-type region 32n included in the second region 32 includes at least one of fullerene or a fullerene derivative.

According to the embodiment, a radiation detector can be provided in which the sensitivity can be increased.

In this specification, the "state of being electrically connected" includes the state in which multiple conductive bodies are physically in contact, and a current flows between the multiple conductive bodies. The "state of being electrically connected" includes the state in which another conductive body is inserted between multiple conductive bodies, and a current flows between the multiple conductive bodies.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in radiation detectors such as conductive layers, first layers, organic semiconductor materials, metal complexes, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all radiation detectors practicable by an appropriate design modification by one skilled in the art based on the radiation detectors described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A radiation detector, comprising:
    a first conductive layer;
    a second conductive layer; and
    a first layer provided between the first conductive layer and the second conductive layer, the first layer including a first region and a second region, the first region including a metal complex including a first metallic element, the second region including an organic semiconductor material, the first metallic element including at least one selected from the group consisting of Ir, Pt, and Pb,
    wherein the organic semiconductor material includes a p-type region and an n-type region,
    the metal complex includes a first portion and a second portion,
    the first metallic element is between the first portion and the second portion,
    the first portion directly contacts one of the p-type region and the n-type region; and
    the second portion directly contacts another one of the p-type region and the n-type region.

2. The detector according to claim 1, wherein a bandgap of the metal complex is larger than a bandgap of the organic semiconductor material.

3. The detector according to claim 1, wherein
the first portion includes fluorine, and
the second portion includes oxygen.

4. The detector according to claim 1, wherein at least a portion of the first region is between the p-type region and the n-type region.

5. The detector according to claim 1, wherein the p-type region includes P3HT (poly(3-hexylthiophene)).

6. The detector according to claim 1, wherein the n-type region includes fullerene.

7. The detector according to claim 1, wherein the n-type region includes $PC_{61}BM$ ([6,6]-phenyl-$C_{61}$-butyric acid methyl ester).

8. The detector according to claim 1, wherein
a bandgap of the metal complex is larger than a bandgap of the p-type region, and
the bandgap of the metal complex is larger than a bandgap of the n-type region.

9. The detector according to claim 1, wherein
a thickness of the first layer along a first direction is 10 µm or more, the first direction being from the second conductive layer toward the first conductive layer.

10. The detector according to claim 1, wherein a concentration of the metal complex in the first layer is 6.4 wt % or more.

11. The detector according to claim 9, wherein the thickness is 40 µm or more.

12. The detector according to claim 1, wherein the metal complex includes iridium.

\* \* \* \* \*